(12) United States Patent
LeClair

(10) Patent No.: US 11,304,298 B2
(45) Date of Patent: Apr. 12, 2022

(54) COAXIAL THRU-VIA CONDUCTOR CONFIGURATIONS IN ELECTRONIC PACKAGING SUBSTRATES

(71) Applicant: Timothy Leigh LeClair, Carlsbad, CA (US)

(72) Inventor: Timothy Leigh LeClair, Carlsbad, CA (US)

( * ) Notice: Subject to any disclaimer, the term of this patent is extended or adjusted under 35 U.S.C. 154(b) by 0 days.

(21) Appl. No.: 17/410,544

(22) Filed: Aug. 24, 2021

(65) Prior Publication Data

US 2022/0071009 A1 Mar. 3, 2022

Related U.S. Application Data

(60) Provisional application No. 63/073,901, filed on Sep. 2, 2020.

(51) Int. Cl.
| | | |
|---|---|---|
| *H05K 1/11* | (2006.01) | |
| *H05K 3/40* | (2006.01) | |
| *H05K 1/09* | (2006.01) | |

(52) U.S. Cl.
CPC ............. *H05K 1/115* (2013.01); *H05K 1/09* (2013.01); *H05K 3/4038* (2013.01); *H05K 2201/095* (2013.01)

(58) Field of Classification Search
CPC ........ H05K 1/115; H05K 1/09; H05K 3/4038; H05K 2201/095
USPC .......................................................... 174/262
See application file for complete search history.

(56) References Cited

U.S. PATENT DOCUMENTS

| | | | |
|---|---|---|---|
| 6,717,071 | B2 | 4/2004 | Chang et al. |
| 2002/0017399 | A1* | 2/2002 | Chang ................... H05K 1/0222 174/262 |
| 2008/0164573 | A1* | 7/2008 | Basker .............. H01L 21/76898 257/621 |
| 2009/0159322 | A1* | 6/2009 | Wu ......................... H05K 1/162 174/260 |
| 2012/0258589 | A1* | 10/2012 | Volant ............... H01L 21/76898 438/653 |

* cited by examiner

*Primary Examiner* — Sherman Ng
(74) *Attorney, Agent, or Firm* — Ortiz & Lopez, PLLC; Kermit D. Lopez; Luis M. Ortiz

(57) ABSTRACT

A coaxial thru-via conductor and a method of fabricating the coaxial thru-via conductor can provide enhanced operations for semiconductor devices mounted on a substrate.

9 Claims, 9 Drawing Sheets

COAXIAL THRU-VIA CONDUCTOR CONFIGURATIONS IN ELECTRONIC PACKAGING SUBSTRATES

CROSS REFERENCE TO PROVISIONAL APPLICATION

This patent application claims priority under 35 U.S.C. § 119 to U.S. Provisional Patent Application Ser. No. 63/073,901 entitled "Coaxial Thru-Via Conductor Configurations in Vitreous Electronic Substrates," which was filed on Sep. 2, 2020, and is incorporated herein by reference in its entirety.

TECHNICAL FIELD

Embodiments are related to thru-via technology for use with substrates for connecting various semiconductor devices. Embodiments further relate to coaxial thru-via conductor configurations used in electronic packaging substrates.

BACKGROUND

The technical attributes of electronic substrates are continuously evolving to support new semiconductor devices, their interconnections, their performance, and their environmental protection. As semiconductor devices are designed to be integrated into higher frequency systems, associated substrates designs require adjustment for these higher frequency applications.

Examples of electronic system products migrating to higher frequencies are computers with faster CPUs, data center memories, fiber optic laser data transmission, and the emerging 5G cellular communication components. In addition, devices which benefit from the use of coaxial thru-via technology are, RF switches, antennas, RF filters, and more. Typical substrates today comprise PCBs which are constructed of resin and weaved fiber glass cannot sustain the required signal integrity as frequencies increase. The transmitted signals become excessively lossy.

Coaxial electrical interconnections have traditionally been used in electronic products that require high signal speeds, shielding from any interference, low signal loss, aligned impedance matching, and other managed resistance properties.

One attempt to provide coaxial thru-vias to an electronic substrate is described in U.S. Pat. No. 6,717,071. This coaxial thru-via conductor includes an outer cylinder-shaped conductor, an inner cylinder-shaped conductor, and an inner insulating fill there between. However, this coaxial thru-via conductor can also include a central unfilled core. In creating such a coaxial via a first hole can be formed through a substrate. (Note that the terms 'coaxial via' and coaxial thru-via' may be utilized interchangeably to refer to the same feature component). Conductive material can be then placed adjacent to the inner wall of the hole to form a first cylinder shaped conductor. Then, a dielectric material can be placed adjacent to the cylinder-shaped conductor to form an insulating fill.

A second hole with a diameter smaller than the first hole can be then formed through the insulating fill. Thereafter, a second cylinder-shaped conductor material can be placed adjacent to the insulating fill leaving an unfilled inner diameter. The process deposits the conductive material is preferably by plating or placing conductive paste. The first and second holes are preferably formed by photo formation or drill formation, such as mechanically drilling, laser-drilling ablation, or plasma ablation. The process to deposit the conductive material can be implemented by plating or placing a conductive paste. Since the high dielectric constant insulating material can deposited by plugging or laminating insulating material, a second hole must be formed. To those skilled in the art, this polymer based insulating material is a low temperature process when used exclusively with a PCB and no difference in process may be indicated with the use of any other substrate.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for coaxial thru-vias conductors used in monolithic electronic substrates.

It is another aspect of the disclosed embodiments to provide for a method of fabricating coaxial thru-vias in monolithic substrates.

The aforementioned aspects and other objectives and advantages can now be achieved as described herein. In an embodiment, a coaxial thru-via conductor on a substrate can include: a first thru-via in the substrate having an inner wall diameter of $D_1$; a first liner ring of conductive material deposited on the interior wall of the thru-via and having an inner diameter of $D_2 < D_1$; a first liner ring of dielectric material deposited on the interior wall of the first conductive material and having an interior diameter of $D_3 < D_2$; and a conductive material deposited on the interior wall of the first layer of dielectric material and filling the remaining interior of the thru-v In an embodiment of the coaxial thru-via conductor, the dielectric substrate can be selected from a group of materials that can include, for example, glass, fused silica, sapphire, vitreous and crystalline materials. Some modified crystalline substrate materials may also benefit from the advantages of coaxial via configurations.

In an embodiment of the coaxial thru-via conductor, the conductive material can be selected from a group that includes silver, gold, and copper.

In an embodiment of the coaxial thru-via conductor, the dielectric material can be selected from a group that includes vitreous glasses, ceramic loaded glasses, recrystallized glasses, oxidized metal materials, high lead glazes, and organic dielectrics.

In another embodiment, a coaxial thru-via conductor on a substrate, can include: a first thru-via in the substrate having an inner wall diameter of $D_1$; a first liner ring of dielectric material coaxially adjacent the inner wall of the first thru-via and having an inner diameter of $D_2 < D_1$, wherein first liner ring of dielectric material is subsequently dried in air and sintered in air to greater than 500 C, but less than 1000 C; a first liner ring of conductive material deposited on the interior wall of the dielectric material, wherein the first liner ring of conductive material is subsequently dried in air and sintered in air to greater than 500 C, but less than 1000 C; a second liner ring of dielectric material coaxially adjacent the inner wall of the thru-via and having an inner diameter of $D_3 < D_2$; wherein the second liner ring of dielectric material is dried in air and sintered in air to greater than 500 C, but less than 1000 C; and conductive material filling a remaining unfilled interior of the first thru-via, wherein the conductive material is dried in air and sintered in air to greater than 500 C, but less than 1000 C.

In an embodiment, the substrate can be silicon. Furthermore, in an embodiment, the inner most conductive material can be selected from a group comprising gold, copper, silver, metal alloys, drawn wire, and various eutectic solder alloys.

In another embodiment, a method of fabricating coaxial thru-vias in monolithic substrates, can involve: forming a first thru-via in the monolithic substrate having and interior diameter of $D_1$; conformal depositing a layer L1 comprising a liner ring of conductive material on the interior wall of the thru-via such that the liner ring of conductive material has an interior of $D_2<D_1$; first air drying and then sintering the liner ring of conductive material; conformal depositing a layer L2 comprising a liner ring of insulating material on the interior wall of the thru-via such that the liner ring of insulating material has an interior diameter of $D_2<D_3$; first air drying and then sintering the liner ring of insulating material; filling the remaining unfilled portion of the thru-via with a conductive material; and first air drying and then sintering the conductive material. An embodiment of the method can further involve hermetically sealing the conducting material with the substrate.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1A:
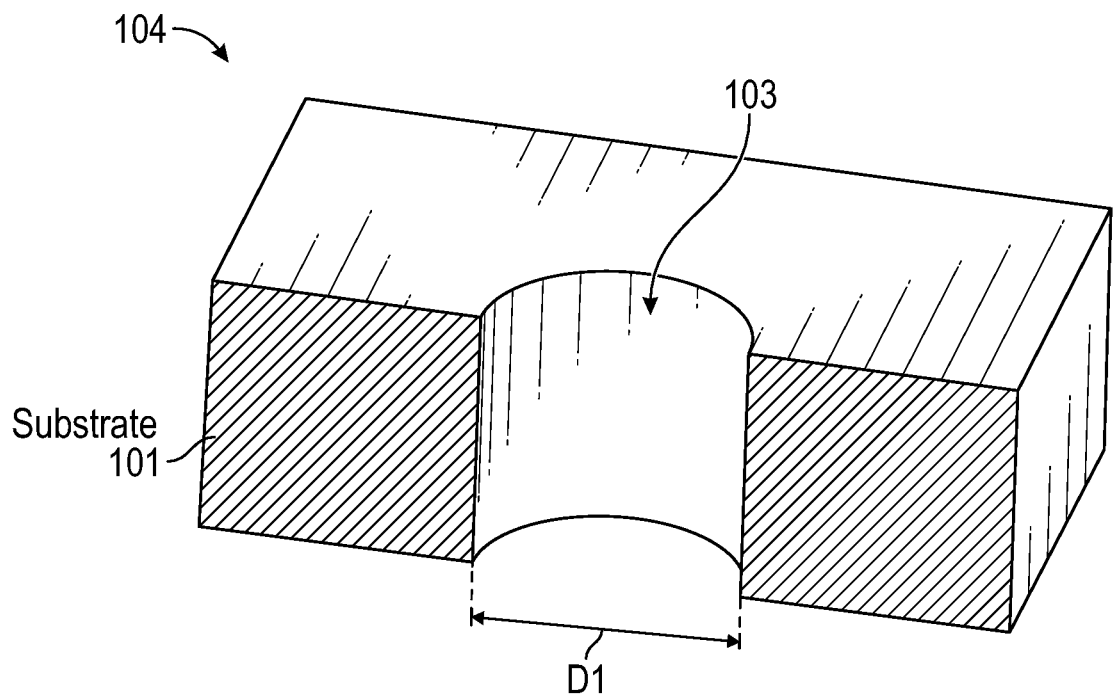
FIG. 1a illustrates a cross sectional perspective view of substrate S with thru-via V, in accordance with an embodiment.

The values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part. In addition, identical reference numerals utilized herein with respect to the drawings can refer to identical or similar parts or components.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As will be discussed in more detail herein, the embodiments can extend the use of the via fabrication "print, dry, fire process sequence" at high temperatures, sintering to greater than 500 C, but less than 1000 C. The embodiments can include coaxial connection technologies for monolithic dielectric vitreous substrates that are the structural base of miniaturized electronic devices. As utilized herein, the term 'substrate' can relate to a solid (usually planar) substance onto which a layer of another substance can be applied, and to which that second substance can adhere. The term 'substrate' as utilized herein may also refer to an 'electronic packaging substrate'.

The embodiments are not limited to the use of vitreous materials. That is, vitreous materials such as the aforementioned monolithic dielectric vitreous substrates can be implemented in some embodiments. The use of such vitreous materials is not a limiting feature of the embodiments. That is, other types of materials may be utilized to implement the substrate(s) discussed herein such as, for example, glass, fused silica, sapphire, crystalline materials, and so on (some modified crystalline substrate materials may also benefit from the advantages of coaxial via configurations).

The coaxial thru-via conductors of the embodiments can be implemented in coaxial thru-via configurations that can beyond standard substrate thru-via designs and address many of the benefits of coaxial connections. Moreover, the coaxial thru-via of the embodiments can use lower dielectric constants, lower loss tangents, provide for tighter interconnect pitches, small thru-via diameters, double sided component placement, smaller component footprints, higher frequency traces, shorter signal path-lengths, low circuit crosstalk, vertically stacked components, lower energy requirements, and increased battery life. Improvements in signal TDR, impedance matching, reflection loss, transmission loss, crosstalk, and energy consumption are all improved over standard thru-via structures. The combination of all the performance parameters noted here cannot be achieved with currently available substrate materials, design configurations, and fabrication methods.

With electronic system products migrating to greater electronic module density and higher frequencies including, but not limited to computers with faster CPUs, data center memories, fiber optic laser data transmission, and emerging 5G cellular communication, coaxial thru-vias of the present invention can improve all the electrical parameters described in this application. Additionally, other devices which benefit from the use of coaxial thru-vias with enhanced electrical performance are high frequency modules, antennas, RF switches, RF filters and more.

The embodiments relate to thru-via conductors, and to methods of manufacture as well as the coaxial thru-via conductors themselves. To more clearly understand such methods and devices the following definitions are provided.

Definitions, Physical Design Properties

Thru-via relates to a cylindrical or tapered open passageway through a dielectric substrate.

Coaxial thru-via relates to a cylindrical or tapered open passageway through a dielectric substrate with a conductive metallic thru-via wall coating which can be then coated with a dielectric layer and finally filled with a center conductive core. With the advent of state-of-the-art laser drilling capabilities, thru-vias can now be fabricated in vitreous and crystalline low dielectric substrates. These thru-vias can be metallized by filling the thru-vias with conductive metals. Solid pillar via fills, whether standard or coaxial, assure the highest conductivity, current-carrying capacity, and meet hermeticity specifications, that are not achievable when using barrel plated vias common in PCB substrates designs. The present invention uses substrates that are monolithic, homogenous, and have a low dielectric constant provides solutions to these design challenges.

Standard fill thru-via relates to a cylindrical or tapered open passageway through a dielectric substrate with a single conductive metallic filling the entire passageway. For signal transmission using standard thru-via technology, the design requires a pair of vias. This type of fill is termed a "standard fill" or a "pillar fill" and can be fabricated as a solid cylinder or plug. Typically, two thru vias may be required. One via can provide the forward current and a second via can provide the return current; whereas a coaxial thru-via may be self-contained with the inner conductor and second (the ground shield) conductor providing paths for both forward and return current thru a single thru-via.

RDL relates to a redistribution layer (RDL), which is a reference name for metallized circuit traces on both the top and bottom of thru-via substrates. The RDL traces can be designed to connect the via caps with components positioned on any dielectric substrate surfaces.

Planarity Recess relates to the distance from via cap to the plane of substrate surface. Good planarity is important for assuring high reliability electrical connection between the via caps and the planar RDL circuit traces.

Hermeticity Testing relates to a determination of the effectiveness of a glass/metal hermetic seal, which may be include a preferred method for testing thru-vias is the "Helium Trace Gas Test." With this method, a mass spectrometer is used to directly detect and measure any leakage of Helium gas penetrating a sealed thru-via in wafer or substrate formats. The test measures the Helium gas flow in "atm×cm$^3$/second" units.

The coaxial thru-vias C of the embodiments is depicted in FIGS. 1a-d and involves progressive depositions of a conductive metal, followed by coating of dielectric, then a final fill with the same conductive metal in the center thru-via core. The repeated sequence of deposition of material coatings or "liners" are applied to the interior walls of a thru-via structure formed in the dielectric substrate. The forming of the thru-vias in a substrate can utilize laser drilling, chemical etching, DRIE, or other methods known in the art.

Referring to FIG. 1a, a perspective cross-sectional view 102 is illustrated, which depicts a thru-via V 103 in a monolithic substrate 101. The thru-via V 103 is cylindrical in shape and possesses a diameter D1. Thru-vias V such as the thru-via V 103 depicted in FIG. 1a can be configured using fabrication methods such as, for example, laser drilling, chemical etching DRIE and so on. These types of thru-vias are cylindrical in shape but can also be tapered. The monolithic substrate shown in FIG. 1a can be selected from a group including glass, fused silica, and sapphire, vitreous or crystalline materials.

Figure 1B:
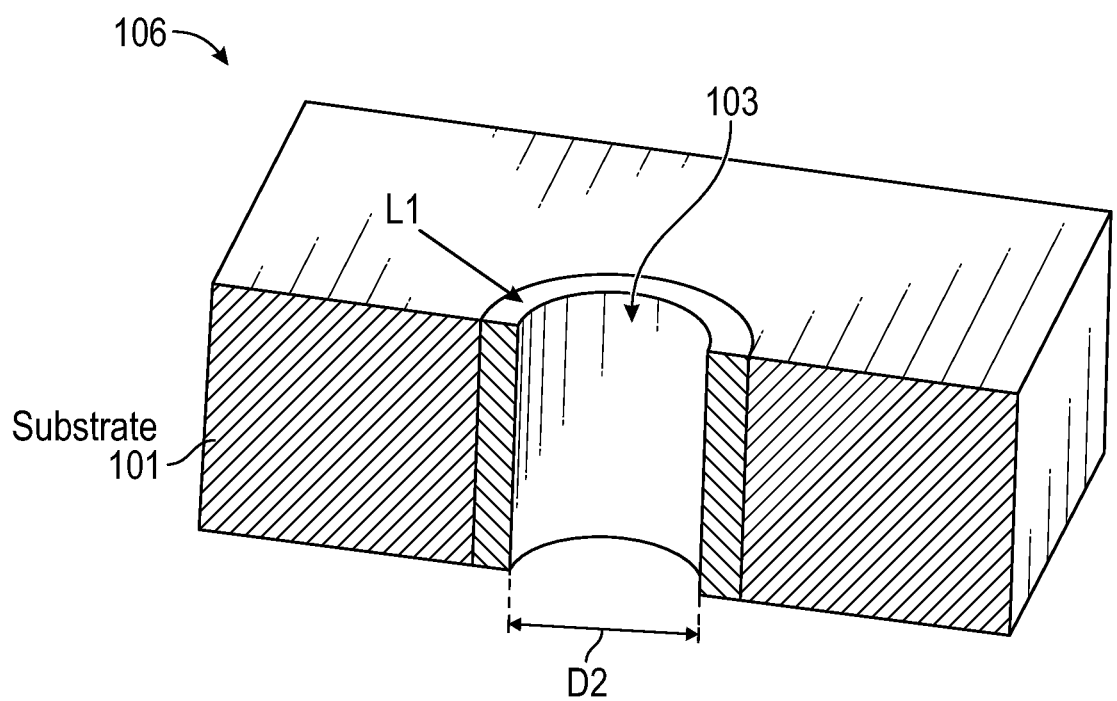
FIG. 1b illustrates a cross sectional perspective view of the substrate S with first liner $L_1$, in accordance with an embodiment.

FIG. 1b illustrates a cross-sectional view 104 of the substrate 101 with a first coating or liner $L_1$ deposited conformally on the interior wall of the thru-via V 103 along its entire length. For other than silicon substrates, the first liner $L_1$ may be a conductive material and can be selected from a group of conductive materials that includes gold, silver, copper, and other conductive materials. The liner $L_1$ includes a layer of conductive material conformally deposited on the interior surface of the thru-via V substrate inner wall forming a ring layer of conductive material reducing the interior diameter of the passageway. This layer/liner can be then dried in air and sintered in air to greater than 500 C, but less than 1000 C.

Figure 1C:
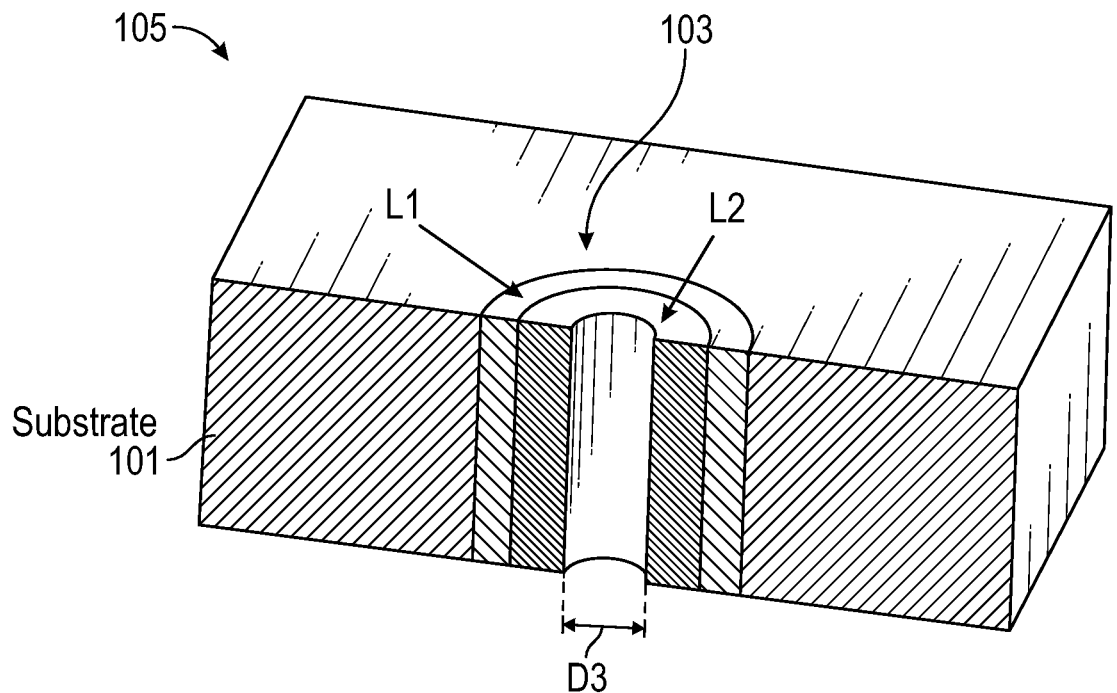
FIG. 1c illustrates a cross sectional perspective view of the substrate S with first and second liners $L_1$ and $L_2$, respectively, in accordance with an embodiment.

FIG. 1c illustrates a cross-sectional view 105 of the substrate 101 configured with a second coating or liner $L_2$ conformally deposited on the interior wall of the preceding liner $L_1$ along its entire length. The second liner $L_2$ is preferably a dielectric material. This layer/liner can be then dried in air and sintered in air to greater than 500 C, but less than 1000 C.

Figure 1D:
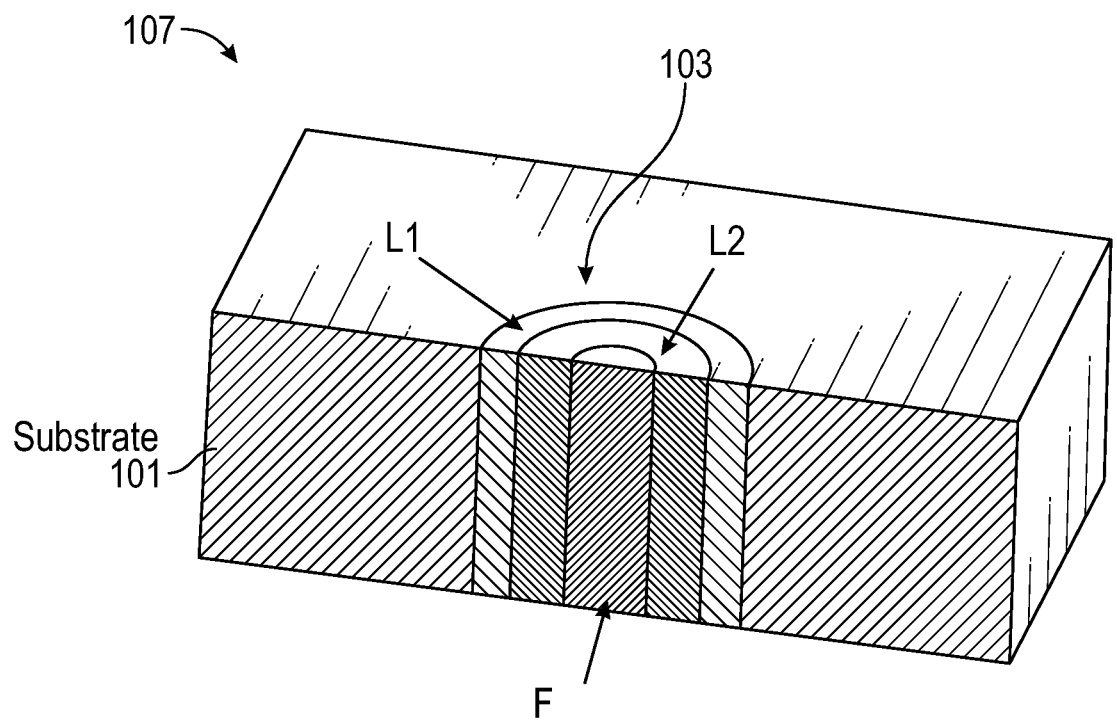
FIG. 1d illustrates a cross sectional perspective view of the substrate S with first and second liners $L_1$ and $L_2$ as well as center fill F, in accordance with an embodiment.

FIG. 1d depicts a cross-sectional view 107 of the substrate 101 with the thru-via V 103 and a center core filler of conductive material F deposited to fill the remaining unfilled thru-via V 103. This final conductive fill can be then dried in air and sintered in air to greater than 500 C, but less than 1000 C.

In a silicon substrate, such as the substrate 101, a dielectric or insulating layer can be formed as the first liner. This can be followed by progressive depositions of a conductive metal, an additional dielectric liner, and then a final core or central fill with the same conductive metal in the center via core as described above.

Figure 2:
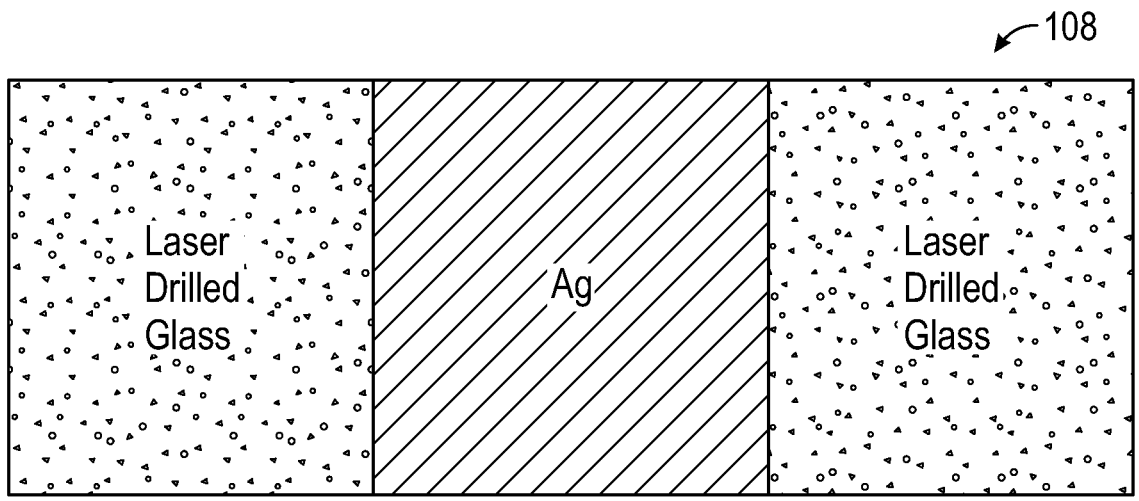
FIG. 2 illustrates a standard fill thru-via, in accordance with an embodiment.
Figure 3:
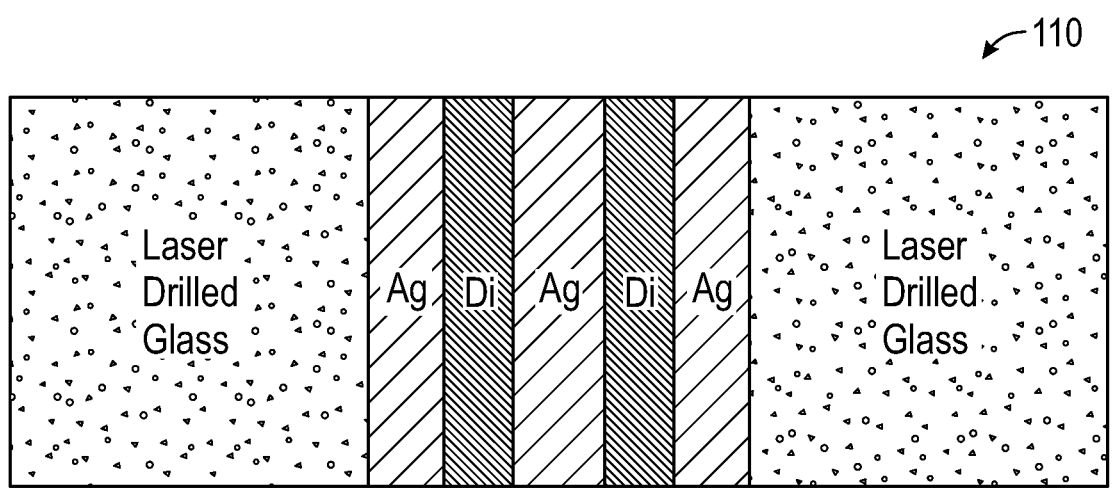
FIG. 3 illustrates an axial fill thru-via, in accordance with an embodiment.

For comparison FIG. 2 and FIG. 3 compare standard fill thru-via with the coaxial thru-via of the embodiments. FIG. 3 depicts a coaxial thru-glass via cross-section view 110, as shown in FIG. 1a to FIG. 1d. FIG. 2, on the other hand, depicts a standard thru-glass via cross-section view 108.

The coaxial thru-via of the disclosed embodiments can also have applications being created, or used, horizontally, or being applied in a horizontal function. An example would be a block with coaxial vias placed between IC chips and using the coax vias in this, now horizontal facing, block to interconnect the IC chips.

Coaxial thru-vias can be created in one or more layers and these layers can have conductor metal. The shape of transmission line metal can be shaped to improve performance at the inputs or outputs of the coaxial thru-vias. The shape of coaxial via can be changed to include multiple sizes of hole diameter, or pin diameter, to change performance. The input and output shape may be altered, such as size or using conical shapes, to improve performance such as in the circuit transition to a transmission line.

Coaxial thru-vias can have uses where a wire, of any length, is inserted in the hole where the center conductor fill would otherwise have been fabricated. This offers ground shielding for the wire.

Coaxial thru-vias can have miniature coax cable attached to the input or output through any means requiring a conductor contact for the outer conductor and the inner conductor. Examples include, but are not limited to, wire or ribbon bonding or solder or shaping a dielectric and coating it with conductor in a manner to assist establishing contact between the cable and via.

Figure 4:
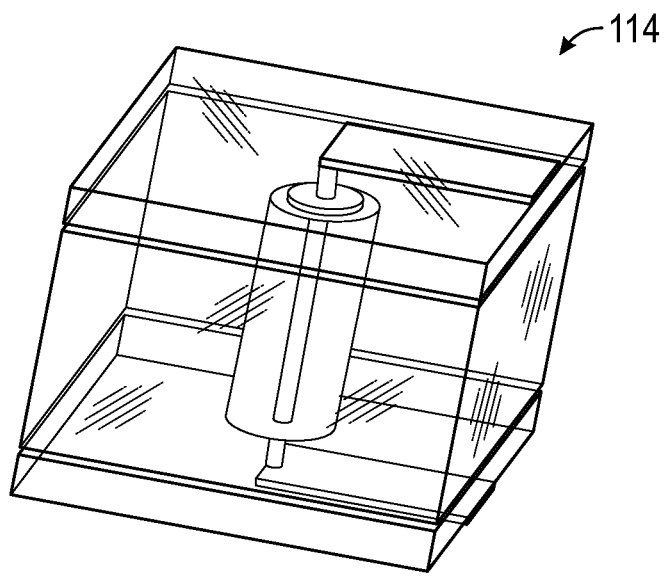
FIG. 4 illustrates a 3D view of a coaxial thru-via, in accordance with an embodiment.
Figure 5:
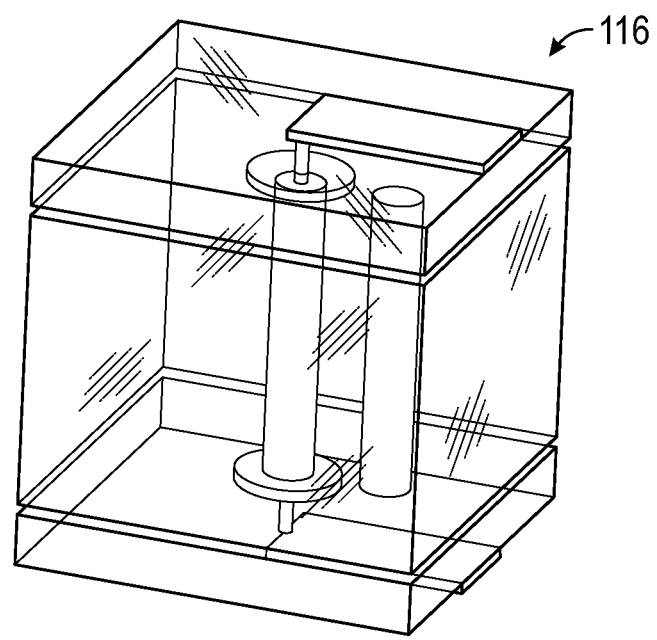
FIG. 5 illustrates a 3D view of a standard fill thru-via, in accordance with an embodiment.

FIG. 4 and FIG. 5 respectively show models 114 and 116, which can be developed for simulation analysis and comparison. For these models, a practical method of feeding the vias to microstrip was created. A ground conductor was printed on the substrate (e.g., such as substrate 101). Next, a layer of dielectric may be coated on the ground conductor. Thereafter, a 50 Ohm width of conductor can be printed on the dielectric to form a microstrip transmission line.

FIG. 4 depicts the coax via having the ground conductor printed with a hole the same diameter, D2, as the dielectric, L2, so that the ground conductor contacts the coax outer conductor, L1, in accordance with an embodiment. The coating of dielectric has a hole centered on the coax fill of diameter, D3. This hole can be filled with conductive material, establishing contact with the microstrip signal conductor. FIG. 4 thus depicts a 3D model 114 of a coaxial thru-via with microstrip transitions.

FIG. 5 depicts a standard via model using the same microstrip configuration such that the signal via can be centered on the hole in the ground conductive material and can establish contact to the microstrip signal through the conductive material filled hole in the coated dielectric. The 2nd via is outside the ground conductive material hole and therefore can establish direct contact to the ground conductive material. FIG. 5 thus illustrates a 3D model 116 of a standard thru-via with microstrip transitions.

Any/all electrical circuit trace connections from the surface of a substrate (named the RDL circuits) can contact the center core conductor of the coaxial thru-via by using a dielectric ring bridge. This dielectric ring bridge permits the RDL signal to contact the coaxial thru-via center core without contacting the ground metal layer of the coaxial thru-via. The signal circuit trace can be positioned (passes) over the dielectric bridge. Furthermore, this dielectric ring can be deposited with a "cut-away" region that can permit a separate RDL trace to contact the ground layer in the coaxial thru-via, as specified in the circuit layout/design.

A layer of conductive material, (L1) can be conformally deposited on the interior surface of the thru-via substrate opening thereby forming a ring layer (termed "the liner") of conductive material, which can reduce the interior diameter of the passageway (D2). This layer/liner can be then dried in air and sintered in air to greater than 500 C, but less than 1000 C.

A layer of a dielectric material, (L2) can be conformally deposited on the interior surface of the conductive ring layer/liner forming a ring/liner layer of dielectric material that can further reduce the interior diameter, (D3) of the substrate opening. This layer/liner can be then dried in air and sintered in air to greater than 500 C, but less than 1000 C. The remaining unfilled portion of the thru-via substrate opening, (F) can be filled with a solid pillar of conductive material. This final conductive fill can be then dried in air and sintered in air to greater than 500 C, but less than 1000 C.

The coaxial thru-via conductor of the disclosed embodiments can offer a number of advantages. From a mechanical standpoint, the coaxial thru-via conductor can allow for device/component miniaturization, tight I/O pitches, small via diameters, while permitting double sided component placement, interconnects for vertical device stacking, higher component placement density, hermetic via sealing assured, and elimination of stress cracking of the dielectrics or substrates.

Several electrical advantages can also result from the coaxial thru-via conductor of the disclosed embodiments. These electrical advantages can include higher frequencies, lower crosstalk, matched impedances, optimized power delivery to circuits/devices, along with broadband improvement. Manufacturing advantages may include benefits from laser drilling technologies, the utilization of a currently installed manufacturing base and well-engineered manufacturing processes, low equipment capital costs, and wafer scale unit device cost benefits.

The properties of substrate materials used in thru-via substrate devices can be defined as follows:

TABLE 1

Properties of Common Substrates for Coaxial and Standard TGVs

| Substrates: | Glass | Fused Silica | Sapphire | Silicon |
|---|---|---|---|---|
| Softening Pt. | 717 C. | >1000 C. | >1200 C. | >1000 C. |
| TCE ×10-7 | 30-35 | 5.5 | 8 | 34 |
| Loss Tangent | 0.0036 | 0.00006 | 0.00002 | 0.015 |
| Er, dielectric K | 9 | 3.8 | 9.3-11.5 | 11.7-12.9 |

Borosilicate Glass relates to a glass formulation that can be useful for electronic substrates. Specific formulation additions to the base silica glass permit forming, shaping, and via drilling at much lower temperatures than these like processes in quartz or fused silica.

Fused Silica relates to a material that may be chemically quartz or silicon dioxide. Fused Silica can be fabricated by various techniques to assure a high purity composition with very low thermal expansion values and a very low dielectric constant.

Silicon is a material that has many electronic applications. Thru-Vias can be fabricated in wafer formatted silicon, for example, using a DRIE (Deep Reactive Ion-Etching) process. Prior to metallizing vias or shaping surface RDL (Redistribution Layer) circuit traces, silicon must be thermally processed to form a controlled thickness oxide layer. This material is in high demand for conventional semiconductor product and therefore is costly.

Sapphire is a mineral of corundum (aluminum oxide) used in the microelectronics industry for substrate applications. Sapphire has a high fracture toughness value and is best utilized with applications that require robust and reliable mechanical strengths.

TABLE 2

Electrical Comparison of Coaxial Via versus Standard Via Structure

| Electrical Parameter: | Standard Thru-Via: | Coaxial Thru-Via: | Design Objective: |
|---|---|---|---|
| TDR, Time Domain Reflectometry | 53 Ohms | 50 Ohms ± 0.2 Ohms | 50 Ohms |
| Impedance Matching | 53 Ohms | 50 Ohms ± 0.2 Ohms | to be matched at 50 Ohms |
| s11, Reflection Loss at 30 GHz | −20.8 dB | −39 dB | to be as negative as possible |
| s21, Transmission Loss at 30 GHz | −0.6 dB | −0.1 dB | to be as close to zero as possible |
| Crosstalk NEXT at 30 GHz | −30 dB | −54 dB | to be as negative as possible |
| Crosstalk FEXT at 30 GHz | −33 dB | −42 dB | to be as negative as possible |

Coaxial Thru-Via Design Advantages; Impedance Matching

Voltage reflections in electric signals are caused by changes in impedance, Z, along the electrical path. If a signal traveling along impedance Z1 encounters a new impedance Z2, then the reflection can be described as s11=(Z1−Z2)/(Z1+Z2).

For standard thru vias, a pair of vias must be used for signal transmission and must be placed near each other to establish the desired impedance. For this type of transmission, the signals have a fringing electric field as the energy moves from the substrate surface, to below the edge of the surface, and to where the electric field establishes itself between the signal via and nearby ground via(s). This causes slight fluctuations in impedance on each end of the thru-vias, near the edges of the substrate which can affect the impedance on the ends of the vias compared to the middle of the vias.

These fluctuations can make it difficult to establish a uniform characteristic impedance along the via's transmission path. An inconsistent characteristic impedance along a signal's path increases reflections, can add losses to transmission, contribute to cross-talk, generate Electromagnetic Interference (EMI), and inhibit higher data speeds required for high speed signals.

Coaxial thru-vias quickly achieve the desired impedance as the signal energy enters or leaves the coax thru-via, without this fringing effect, as the coaxial vias have a self-contained ground shield and the electric field quickly establishes itself between the center conductor and the second conductor that form the ground shield. This unique coaxial structure assures a uniform characteristic impedance throughout the length of the thru-via, as the electric fields extend radially from the center conductor towards the second conductor surrounding it.

Coaxial Thru-Via Design Advantages; Signal Speed and Isolation

The coaxial thru-via configuration provides a number of signal transmission enhancements. Table 2 presents the comparative electrical parameters of using coaxial thru-vias to standard thru-vias. Marked improvement is noted in signal TDR, impedance matching, reflection loss, transmission loss, and crosstalk (the electrical isolation when measuring NEXT and FEXT) when comparing coaxial to standard thru-via configurations.

Coaxial Thru-Via Design Advantages; Miniaturization

Coaxial thru-vias support microelectronic device miniaturization in the following novel manners; one, higher frequency coaxial thru-via designs have integrated ground shields negating the need for addition distinct separate ground vias, and two, closer component placement will require less substrate surface area enhancing device densification. Miniaturization is a design objective for the expanded use of vitreous substrates. Vitreous substrates are monolithic, homogeneous, and permit fine laser drilled via diameters with tight pitches which meet these design miniaturization goals that cannot be realized with legacy PCB multilayer substrate technologies.

Coaxial Thru-Via Design Advantages; Antennas

Coaxial thru-vias can be used as antenna feeds or can be made into antennas themselves. This can include configurations where they have modifications made to them so that they radiate in a designed manner; including customizing conductor shapes, drilling down the center conductor to a certain distance, changing the shape of the via such as hole size or conical shaping, and setting these antenna structures into multiples to create or feed arrays of antennas and steerable arrays of antenna.

Coaxial Thru-Via Design Advantages; Power Distribution

Electrical power delivery can also benefit from the use of coaxial thru-vias. Efficient power delivery reduces the energy requirements for any device and extends the battery life in mobile electronic products.

Low impedance, low inductance, and low coupling is desired in power delivery to microchips and IC devices. A coaxial thru-via can be optimized for low impedance by customizing the dielectric constant in the via dielectric liner layer (see FIG. 3, cross-section diagram). The dielectric liner layer can also be adjusted in thickness to optimize impedance for power delivery.

Traditional power delivery uses multiple via pairs (voltage and ground) to reduce inductance and impedance. Each via pair can be replaced with a single coaxial thru-via; reducing the area, normally required to position two vias, while also providing shielding and reducing unwanted crosstalk to other power and/or signal vias.

Coaxial Thru-Via Design Advantages; Simulation Verification

In this patent application, 3D Full Field simulations show improved electrical performance of coaxial thru-vias when compared to standard thru-vias. Performance improvements are documented and plotted for Impedance, Reflection, Transmission, Near End Cross-Talk, and Far End Cross-Talk in the numbered figures of this application as indicated below.

Figure 6:
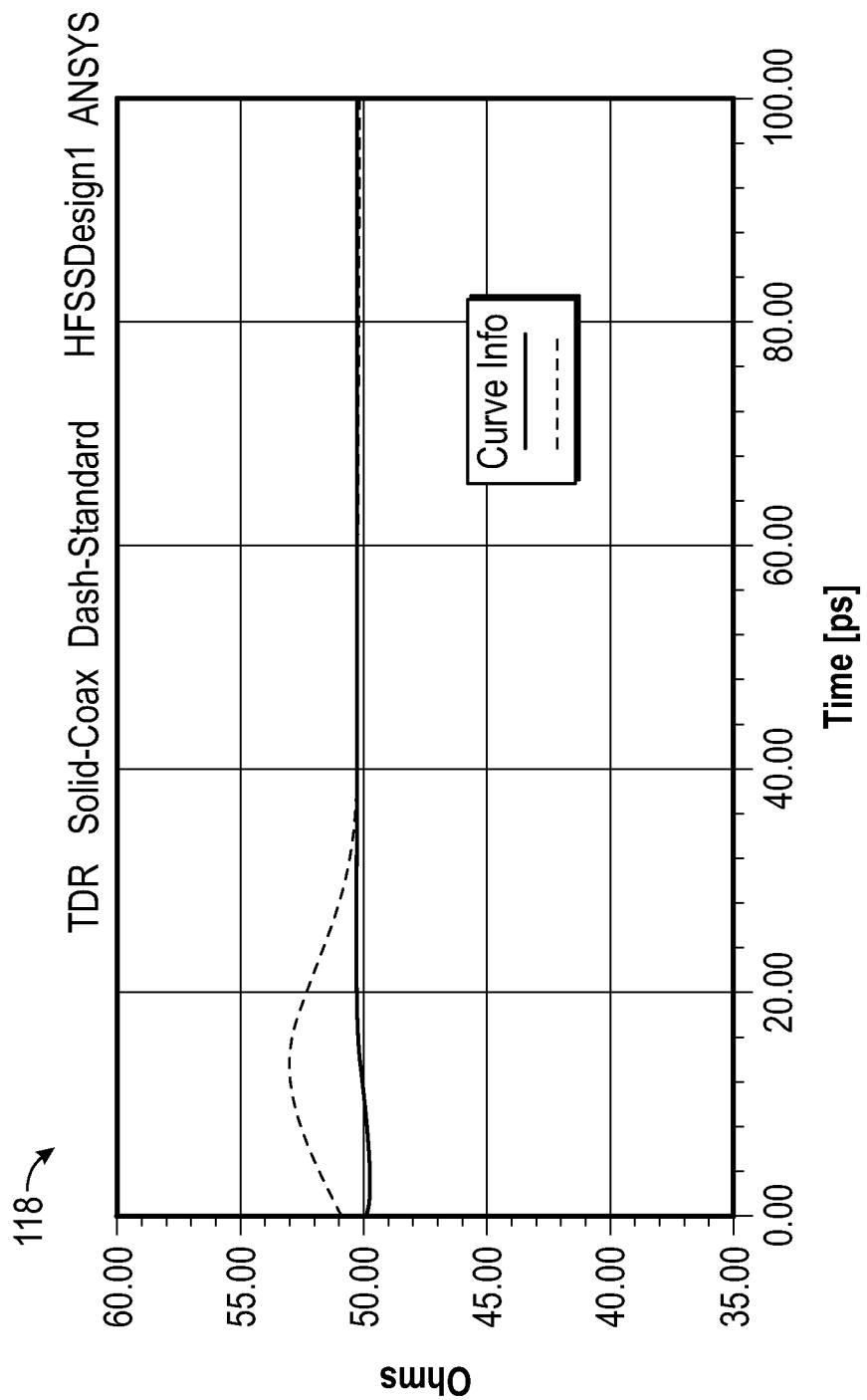
FIG. 6 illustrates a graph depicting TDR (Time Domain Reflectometry), in accordance with an embodiment.

FIG. 6 illustrates a graph 118 depicting the impedance of coaxial via vs. standard via based on the simulation of a signal launched microstrip, through the vias, and onto microstrip on the opposite side of a substrate such as substrate 101. FIG. 6 shows the TDR comparing the two 3D simulation models 114 and 116, respectively shown in FIG. 4 and FIG. 5, defining the transitioning microstrip from the coax via and standard vias configuration. The coax thru-via can be configured with a design optimized impedance match, very close to 50 Ohms (while the standard vias are near 53 Ohms, which can generate the mismatch losses discussed herein).

Figure 7:
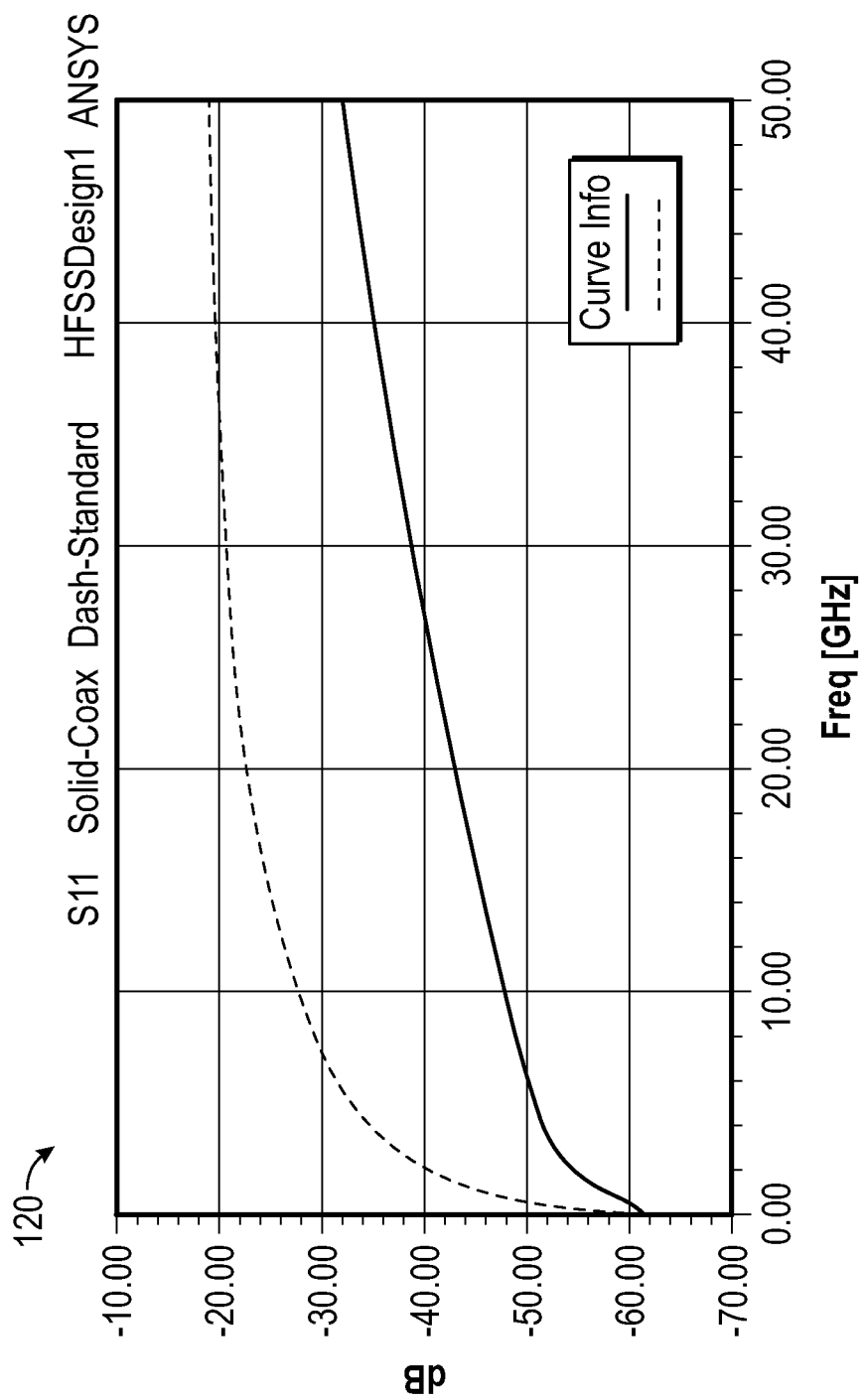
FIG. 7 illustrates a graph depicting s11 reflection, in accordance with an embodiment.

FIG. 7 illustrates a graph 120 depicting s11 Reflection Loss at DC to 50 GHz and based on a simulation of the signals launched from a microstrip, thru the vias, and onto a microstrip on the opposite side of the substrate 101. Graph 120 of FIG. 7 shows the reflection, comparing the coax and standard thru-vias. The coax thru-via shows an 18 dB improvement in Return Loss at 30 GHz, when compared to a standard thru-via.

Figure 8:
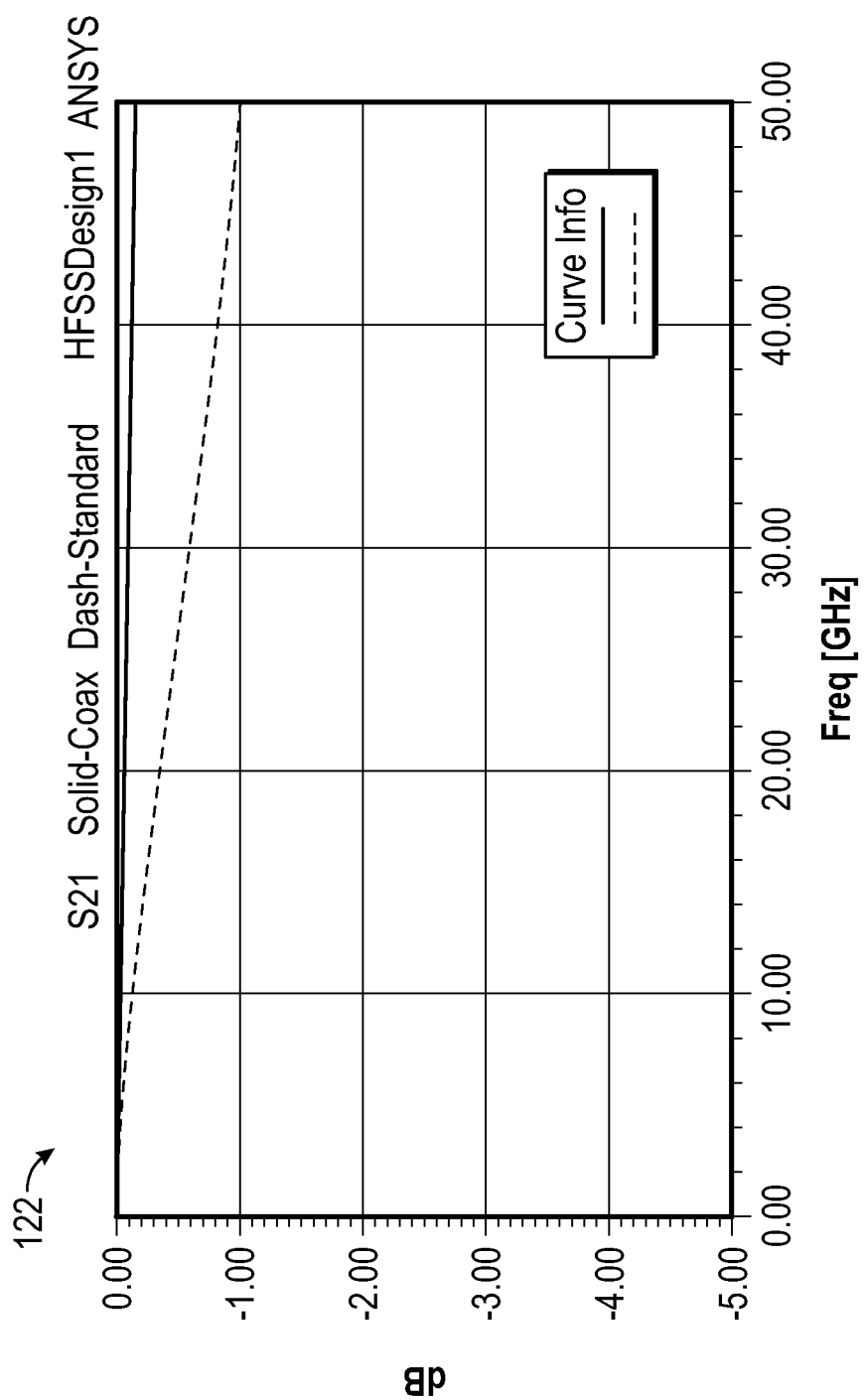
FIG. 8 illustrates a graph depicting s22 reflection, in accordance with an embodiment.

FIG. 8 illustrates a graph 122 depicting s21 Transmission Loss at DC to 50 GHz based on a simulation of the signal launched onto a microstrip, thru the vias, and onto a microstrip on the opposite side of the substrate 101. Graph 122 of FIG. 8 shows the transmission, comparing the coaxial and standard vias. The coaxial via performs better than the standard via with 0.5 dB better Insertion Loss at 30 GHz.

Figure 9:
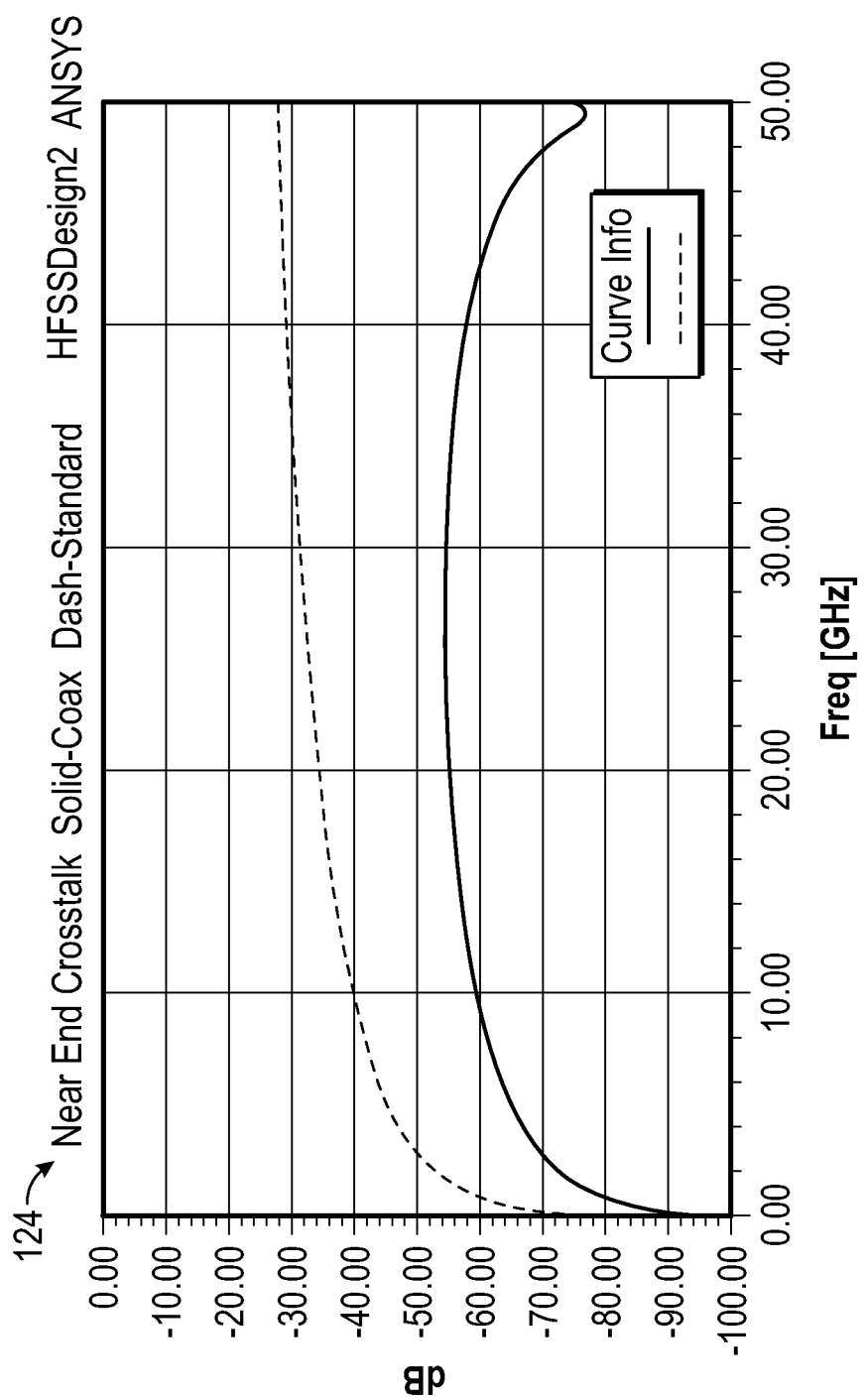
FIG. 9 illustrates a graph depicting cross talk NEXT, in accordance with an embodiment.

FIG. 9 illustrates a graph 124 depicting Crosstalk NEXT at DC to 50 GHz and simulated using a pair of microstrip-to-via transitions, positioned 200 microns apart. Graph 124 of FIG. 9 shows the comparison of Near End Cross-Talk. The coaxial via is better than the standard via with 24 dB less NEXT at 30 GHz.

Figure 10:
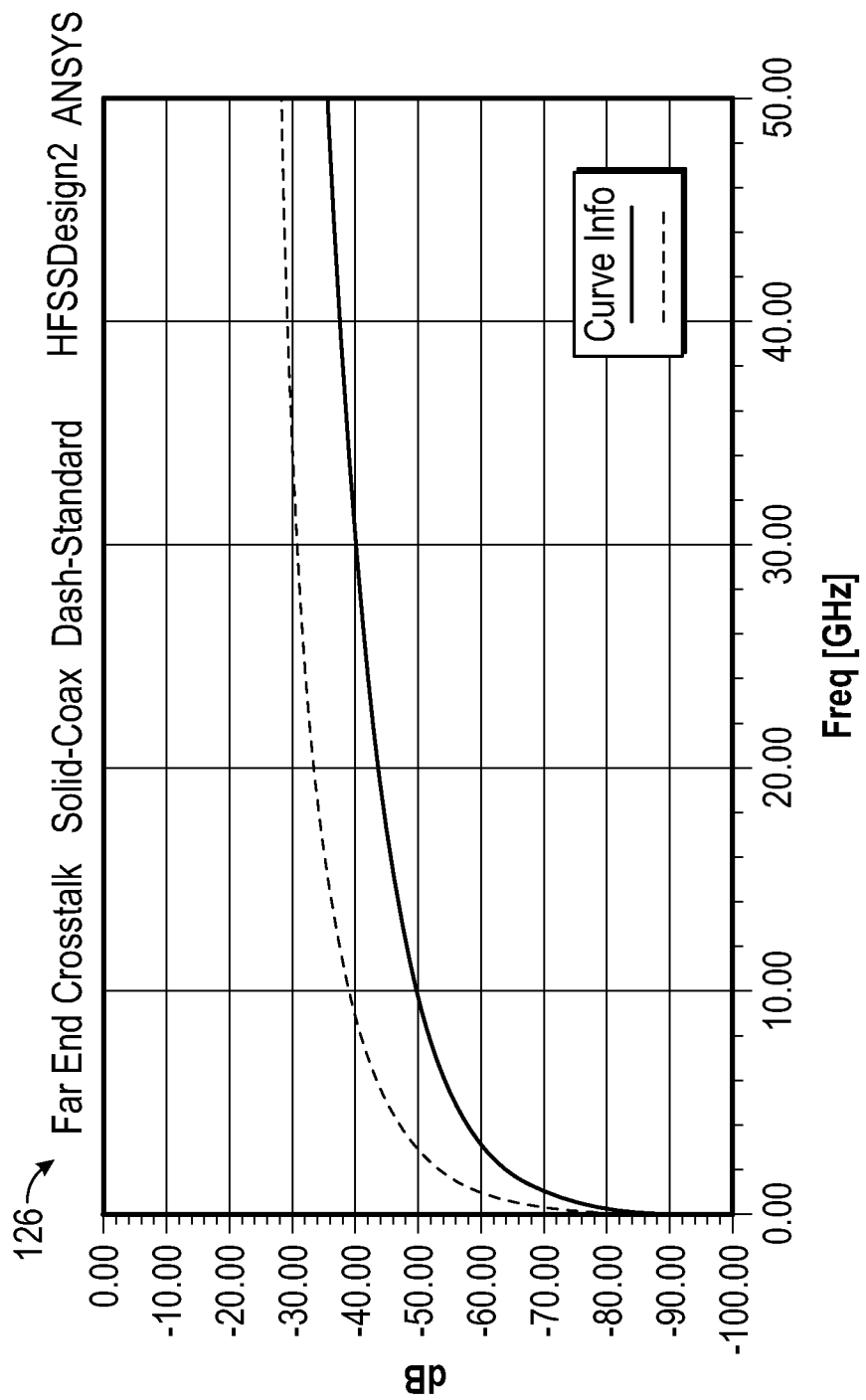
FIG. 10 illustrates a graph depicting cross talk at DC to 50 GHz, in accordance with an embodiment.

FIG. 10 illustrates a graph 1236 depicting Crosstalk FEXT at DC to 50 GHz and simulated using a pair of microstrip-to-via transitions, positioned 200 microns apart. Graph 126 of FIG. 10 shows the comparison of Far End Cross-Talk. The coaxial via is better than the standard via with 9 dB less FEXT at 30 GHz.

Coaxial Thru-Via Design Advantages; Module and System Benefits

The benefits of the coaxial structures further extend to the performance of modules themselves to include but not limited to improvements in inductive capacitive (LC) filter designs, antennas, power delivery, efficient use of routing area, and high-speed transitions, typically requiring multiple vias to carry both forward and return currents.

Coaxial thru-vias offer further improvements to electromagnetic field crosstalk, capacitive and inductive, due to the nature of a field of vias sharing electromagnetic fields, are simplified into a single thru-via transporting the forward and return signal path while shielding the signal current from other signals' current.

The table below clearly demonstrates the performance benefits of selecting monolithic vitreous substrates for a higher frequency device designs, as opposed to using legacy organic resin PCB substrates with their inherent electrical signal loss characteristics.

TABLE 3

Properties of Vitreous Substrates compared with PCBs

| Technology Comparison: | Vitreous Substrates: | Printed Circuit Boards (PCBs): |
|---|---|---|
| Structure | Monolithic, homogeneous | Multilayer; organic resin over glass fiber weave |
| Strength | Rigid | Pliable |
| Tan Delta; Loss Tangent | 0.00006 (Fused Silica) | 0.018 (FR4, as PCB standard) |

TABLE 3-continued

Properties of Vitreous Substrates compared with PCBs

| Technology Comparison: | Vitreous Substrates: | Printed Circuit Boards (PCBs): |
|---|---|---|
| Loss per unit distance at 30 GHz; Identical Striplines | 0.008 dB (over 300X Improvement) | 2.435 dB (very lossy) |
| Temperature used for Fabrication | High temp (>500 C.) forms dense conductor pillar vias | Low temp (<100 C.), forms lossy plated open core vias |
| Signal conductivity | Provides highly conductive filled pillar core | Results in poor conductor "barrel" coated open core via |

Definitions, Electrical Properties

TDR; Time Domain Reflectometry relates to the impedance of the transmission path, in Ohms, relative to time required to travel to the impedance location, and back.

Dielectric Constant expresses the extent a material may concentrate electric flux. The dielectric constant of a medium is the ratio of the absolute permittivity of the medium, relative to the permittivity of a vacuum. It is a complex, unitless number often expressed as a function of frequency so that Er(w)=E'r(w)−jE"r(w), where w is frequency expressed in radians per second.

Dielectric Constant Impact on Signal Velocity relates to the dielectric constant of the medium gets lower, the velocity of the signal increases. The velocity of the signal is the speed-of-light divided by the square root of the dielectric constant: V=c/SQRT(Er).

Loss Tangent relates to the imaginary part of the dielectric constant causes the dielectric loss. Loss Tangent can be expressed as the tangent of the real and imaginary components of the dielectric constant (Loss Tangent=tan(Er"/Er')).

s11 is a ratio between 0 and 1. It is the output voltage at port 1, divided by the input voltage at port 1. This is Return Loss when converted to dB with the formula, −20*Log(s11). For plotting purposes, the negative Return Loss is plotted so that the best return loss is the most negative number.

s21 is a ratio between 0 and 1. It is the output voltage at port 2, divided by the input voltage at port 1. This is Insertion Loss when converted to dB with the formula, −20*Log(s21). For plotting purposes, the negative Insertion Loss is plotted so that the best insertion loss is the smallest negative number.

NEXT (Near End Cross-Talk) is the output voltage at the nearest port, port 3, of the adjacent line divided by the input voltage at port 1. NEXT can be plotted as 20*Log(s31) and the best NEXT is the most negative number.

FEXT (Far End Cross-Talk) is the output voltage at the furthest port, port 4, of the adjacent line, divided by the input voltage at port 1. FEXT can be plotted as 20*Log(s41) and the best FEXT is the most negative number.

Impedance Matching relates to creating a desired characteristic impedance with standard vias is dependent on the physical distance between the signal (forward current) via and the ground (return current) via (or vias, as the return current can use more than one via). Impedance Matching may require a design layout effort to place neighboring return (ground) vias in proximity to the signal via in such a way as to balance the inductance and capacitance to create the desired impedance target, such as commonly 50 Ohms.

Bandwidth relates to the difference between the upper and lower frequencies in a continuous band of frequencies. For a system, bandwidth could be the range of frequencies over which the system produces a specified level of performance. The coax thru-vias have more bandwidth compared to standard thru vias when comparing electrical performance of reflection, transmission, near end cross-talk, and far end cross-talk.

Hermeticity relates to a thru via design and fabrication process that assure hermeticity to Helium gas that meets standard industry leak rates. This application describes metallized via constructions that achieve hermeticity leak rates at less than 1×10-9 "atm×cm$^3$/second" units.

With currently available materials and design configurations, standard thru-vias cannot meet the signal quality requirements at the necessary higher frequencies to be used in new device/product applications, such as 5G technologies and others. Miniaturization is an important design benefit of coaxial thru-vias in vitreous substrates. Current standard thru-via technologies require more substrate "footprint" space needed in component layout; coaxial thru-vias reduce that space by integrated the signal and ground into a single coaxial thru-via. The use of monolithic vitreous glass substrates with the novel fabrication techniques and coaxial thru vias also can also be hermetically sealed for environmental protection. This novel invention provides a solution to the identified existing problems and more.

It can be appreciated that a number of embodiments are disclosed herein including preferred and alternative embodiments. For example, in an embodiment, a coaxial thru-via conductor on a substrate can include: a first thru-via in the substrate having an inner wall diameter of $D_1$; a first liner ring of conductive material deposited on the interior wall of the thru-via and having an inner diameter of $D_2<D_1$, a first liner ring of dielectric material deposited on the interior wall of the first conductive material and having an interior diameter of $D_3<D_2$; and a conductive material deposited on the interior wall of the first layer of dielectric material and filling the remaining interior of the thru-via.

In an embodiment of the coaxial thru-via conductor, the dielectric substrate can be selected from a group that includes glass, fused silica, and sapphire, vitreous or crystalline materials.

In an embodiment of the coaxial thru-via conductor, the conductive material can be selected from a group including silver, gold, and copper.

In an embodiment of the coaxial thru-via conductor, the dielectric material can be selected from the group including vitreous glasses, ceramic loaded glasses, recrystallized glasses, oxidized metal materials, high lead glazes, organic dielectrics and more.

In an embodiment, the first thru-via in the substrate can include an inner wall diameter of $D_1$; a first liner ring of dielectric material coaxially adjacent the inner wall of the thru-via and having an inner diameter of $D_2<D_1$ (this layer/liner can be then dried in air and sintered in air to greater than 500 C, but less than 1000 C); a first liner ring of conductive material deposited on the interior wall of the dielectric material (this layer/liner can be then dried in air and sintered in air to greater than 500 C, but less than 1000 C); a second liner ring of dielectric material coaxially adjacent the inner wall of the thru-via and having an inner diameter of $D_3<D_2$ (this layer/liner can be then dried in air and sintered in air to greater than 500 C, but less than 1000 C); and conductive material filling the remaining unfilled interior of the thru-via (this layer/liner can be then dried in air and sintered in air to greater than 500 C, but less than 1000 C).

In an embodiment, the substrate can be silicon.

In an embodiment, the inner most conductive material can be selected from a group including gold, copper, silver, metal alloys, drawn wire, and various eutectic solder alloys.

In an embodiment, a method of fabricating coaxial thru-vias in monolithic substrates, can include steps operations comprising: a) forming a first thru-via in the monolithic substrate having and interior diameter of $D_1$; b) conformal depositing a layer $L_1$ comprising a liner ring of conductive material on the interior wall of the thru-via such that it has an interior of $D_2<D_1$; c) first air drying and then sintering such liner ring of conductive material; d) conformal depositing a layer $L_2$ comprising a liner ring of insulating material on the interior wall of the thru-via such that it has an interior diameter of $D_2<D_3$; e) first air drying and then sintering such liner ring of insulating material; f) filling the remaining unfilled portion of the thru-via with a conductive material; and g) first air drying and then sintering such interior conductive material. In an embodiment, the method can further include hermetically sealing the conducting material with the substrate.

The embodiments thus relate to coaxial thru-vias conductors in monolithic electronic substrates. The embodiments include both a method for manufacturing coaxial thru-via conductors as well as a coaxial thru-via conductor structure. In particular, the coaxial thru-via conductor can comprise a thru-via in a dielectric substrate wherein such thru-via forms a generally cylindrical or tapered passageway in a substrate. Such thru-vias can be formed through the use of laser drilling, chemical etching, DRIE, or other methods. A layer of conductive material can be conformally deposited on the interior surface of the thru-via passageway forming a ring layer of conductive material reducing the interior diameter of the passageway. A layer of a dielectric material is conformally deposited on the interior surface of the conductive ring layer forming a ring layer of dielectric material further reducing the interior diameter of the passageway. The remaining unfilled portion of the thru-via passageway is filled with conductive material.

The inventors have realized a non-abstract technical solution to the technical problem to improve a thru-via technology for use with substrates for connecting various semiconductor devices. The disclosed embodiments offer technical improvements to thru-via technologies used with substrates for connecting various semiconductor devices, including non-abstract improvements to the technical problem(s) identified in the background section of this disclosure.

It will be appreciated that variations of the above-disclosed and other features and functions, or alternatives thereof, may be desirably combined into many other different systems or applications. It will also be appreciated that various presently unforeseen or unanticipated alternatives, modifications, variations, or improvements therein may be subsequently made by those skilled in the art which are also intended to be encompassed by the following claims.

What is claimed is:

1. A coaxial thru-via conductor on a substrate, comprising:
    a first thru-via in the substrate having an inner wall diameter of $D_1$;
    a first liner ring of conductive material deposited on the interior wall of the thru-via and having an inner diameter of $D_2<D_1$, wherein the first liner ring of conductive material is subsequently dried in air and sintered in air to greater than 500° C., but less than 1000° C.;
    a first liner ring of dielectric material deposited on the interior wall of the first conductive material and having an interior diameter of $D_3<D_2$, wherein the first liner ring of dielectric material is subsequently dried in air and sintered in air to greater than 500° C., but less than 1000° C.; and a conductive material deposited on the interior wall of the first layer of dielectric material and filling the remaining interior of the thru-via, wherein the conductive material is dried in air and sintered in air to greater than 500° C., but less than 1000° C.

2. The coaxial thru-via conductor of claim 1, wherein the substrate comprises a dielectric substrate selected from a group comprising: glass, fused silica, sapphire, vitreous or crystalline materials.

3. The coaxial thru-via conductor of claim 1, wherein the conductive material is selected from a group comprising: silver, gold, and copper.

4. The coaxial thru-via conductor of claim 1, wherein the dielectric material is selected from a group comprising: vitreous glasses, ceramic loaded glasses, recrystallized glasses, oxidized metal materials, high lead glazes, and organic dielectrics.

5. A coaxial thru-via conductor on a substrate, comprising:

a first thru-via in the substrate having an inner wall diameter of $D_1$;

a first liner ring of dielectric material coaxially adjacent the inner wall of the first thru-via and having an inner diameter of $D_2<D_1$, wherein first liner ring of dielectric material is subsequently dried in air and sintered in air to greater than 500° C., but less than 1000° C.;

a first liner ring of conductive material deposited on the interior wall of the dielectric material, wherein the first liner ring of conductive material is subsequently dried in air and sintered in air to greater than 500° C., but less than 1000° C.;

a second liner ring of dielectric material coaxially adjacent the inner wall of the thru-via and having an inner diameter of $D_3<D_2$, wherein the second liner ring of dielectric material is dried in air and sintered in air to greater than 500° C., but less than 1000° C.; and a conductive material filling a remaining unfilled interior of the first thru-via, wherein the conductive material is dried in air and sintered in air to greater than 500° C., but less than 1000° C.

6. The coaxial thru-via conductor of claim 5, wherein the substrate comprises silicon.

7. The coaxial thru-via conductor of claim 5, wherein the inner most conductive material is selected from a group comprising gold, copper, silver, metal alloys, drawn wire, and various eutectic solder alloys.

8. A method of fabricating coaxial thru-vias in a monolithic substrate, comprising: forming a first thru-via in the monolithic substrate having and interior diameter of $D_1$;

conformal depositing a layer $L_1$ comprising a liner ring of conductive material on the interior wall of the thru-via such that the liner ring of conductive material has an interior diameter of $D_2<D_1$;

first air drying and then sintering the liner ring of conductive material in air to greater than 500° C., but less than 1000° C.;

conformal depositing a layer $L_2$ comprising a liner ring of insulating material on the interior wall of the thru-via such that the liner ring of insulating material has an interior diameter of $D_3<D_2$;

first air drying and then sintering the liner ring of insulating material in air to greater than 500° C., but less than 1000° C.;

filling the remaining unfilled portion of the thru-via with a conductive material; and first air drying and then sintering the conductive material in air to greater than 500° C., but less than 1000° C.

9. The method of claim 8, further comprising hermetically sealing the conducting material with the monolithic substrate.

* * * * *